United States Patent
Saxod et al.

(10) Patent No.: US 10,468,440 B2
(45) Date of Patent: Nov. 5, 2019

(54) STORAGE ZONE FOR AN IMAGE ARRAY PIXEL

(71) Applicant: Commissariat à l'Energie Atomique et aux Energies Alternatives, Paris (FR)

(72) Inventors: Olivier Saxod, Brignoud (FR); Marie Guillon, Fontanil-Cornillon (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 15/959,763

(22) Filed: Apr. 23, 2018

(65) Prior Publication Data
US 2018/0315784 A1 Nov. 1, 2018

(30) Foreign Application Priority Data
Apr. 28, 2017 (FR) .................... 17 53771

(51) Int. Cl.
*H01L 27/146* (2006.01)
(52) U.S. Cl.
CPC ...... *H01L 27/1461* (2013.01); *H01L 27/1463* (2013.01); *H01L 27/14607* (2013.01); *H01L 27/14609* (2013.01); *H01L 27/14612* (2013.01); *H01L 27/14643* (2013.01); *H01L 27/14689* (2013.01)
(58) Field of Classification Search
CPC .......... H01L 27/1461; H01L 27/14607; H01L 27/14609; H01L 27/14612; H01L 27/1463; H01L 27/14643; H01L 27/14689
See application file for complete search history.

(56) References Cited

U.S. PATENT DOCUMENTS

| | | | |
|---|---|---|---|
| 8,804,021 B2 | 8/2014 | Manabe et al. | |
| 9,793,312 B1 | 10/2017 | Roy | |
| 2010/0073541 A1 | 3/2010 | Kawahito | |
| 2011/0241090 A1 | 10/2011 | Mao et al. | |
| 2012/0018618 A1 | 1/2012 | Roy | |

FOREIGN PATENT DOCUMENTS

| | | |
|---|---|---|
| CN | 103094292 A | 5/2013 |
| CN | 206022365 U | 3/2017 |
| WO | 2009147863 A3 | 12/2009 |

OTHER PUBLICATIONS

Preliminary Search Report in French Patent Application No. 1753771 dated Feb. 6, 2018, 2 pages.
Lange, Robert et al.; Solid-State Time-of-Flight Range Camera; IEEE Journal of Quantum Electronics; vol. 37, No. 3; Mar. 2001, pp. 390-397.

*Primary Examiner* — Dale E Page
*Assistant Examiner* — Quovaunda Jefferson
(74) *Attorney, Agent, or Firm* — Moreno IP Law LLC

(57) ABSTRACT

The invention concerns a pixel of an image array comprising one or more charge storage structures (200), each charge storage structure comprising: a first charge storage trench (202) doped to have a first conductivity type and having a first end (208) configured to receive charge accumulated by a photodiode; a second charge storage trench (204) doped to have the first conductivity type; and a first transfer gate (212) linking a second end (214) of the first charge storage trench (202) and the second charge storage trench (202, 204) to a sense node (216), wherein the first and second charge storage trenches are linked together by a linking channel (206) doped to have the first conductivity type and bordering a portion of an edge of the transfer gate (212).

12 Claims, 6 Drawing Sheets

STORAGE ZONE FOR AN IMAGE ARRAY PIXEL

FIELD

The present disclosure relates to the field of image arrays, and in particular to a pixel of an image array comprising one or more charge storage zones.

BACKGROUND

It has been proposed to incorporate charge storage zones in pixels of an image sensor. For example, such charge storage zones permit the storage of charge carriers from a photodiode following a global shutter operation. As a further example, charge storage zones permit the storage of charge carriers in time-of-flight image sensors that are able to measure depth information from an image scene.

As the size of CMOS pixels is reduced, the space available for the charge storage zones is also being reduced. Charge storage zones of reduced size permit fewer electrons or holes to be stored, resulting in a degradation of the dynamic range of the pixel, and thus the signal to noise ratio.

It has been proposed to provide charge storage zones in the form of doped trenches that are laterally pinched by CDTIs (capacitive deep trench isolations) in order to hold charge carriers therein. There is a technical difficulty in extending the size of such trenches while maintaining a compact pixel layout, avoiding increasing the time lag for evacuating the charge, and/or losing the ability to read the entire storage zone.

SUMMARY

It is an aim of embodiments of the present description to at least partially address one or more difficulties in the prior art.

According to one aspect, there is provided a pixel of an image array comprising one or more charge storage structures, each charge storage structure comprising: a first charge storage trench doped to have a first conductivity type and having a first end configured to receive charge accumulated by a photodiode; a second charge storage trench doped to have the first conductivity type; and a first transfer gate linking a second end of the first charge storage trench, and the second charge storage trench, to a sense node, wherein the first and second charge storage trenches are linked together by a linking channel doped to have the first conductivity type and bordering a portion of an edge of the transfer gate.

According to one embodiment, the linking channel has a width of between 20 nm and 300 nm.

According to one embodiment, the linking channel comprises a right-angled bend.

According to one embodiment, the linking channel provides an electrostatic potential barrier between the first and second charge storage trenches, the linking channel being configured such that the electrostatic potential barrier is lower than an electrostatic potential barrier between the first charge storage trench and the sense node.

According to one embodiment, the dimensions of the linking channel, the doping concentration in the linking channel, and/or a voltage level applied to the first transfer gate, are configured such that the energy gap separating the linking channel and the sense node is at least 10 kT, where k is the Boltzmann constant, and T is the temperature.

According to one embodiment, the second charge storage trench extends perpendicular to the first charge storage trench.

According to one embodiment, in addition to said first and second charge storage trenches, each charge storage structure comprises at most two further charge storage trenches, the trenches of each charge storage structure forming a "T" shape or a cross shape.

According to one embodiment, the pixel further comprises a photodiode linked to the first charge storage trench by a second transfer gate.

According to one embodiment, the first and second charge storage trenches are laterally delimited along at least a portion of their length by capacitive isolation trenches configured to be biased by a biasing voltage.

According to one embodiment, the pixel further comprises a third charge storage trench doped to have the first conductivity type and linked to the first or second charge storage trench by a further linking channel doped to have the first conductivity type and bordering a further portion of the edge of the transfer gate.

According to one embodiment, the pixel comprises a plurality of the charge storage structures.

According to a further aspect, there is provided an image array comprising an array of pixels, each pixel corresponding to the above pixel.

According to a further aspect, there is provided a method of fabricating a pixel of an image array, the method comprising forming one or more charge storage structures, each charge storage structure being formed by: forming a first charge storage trench doped to have a first conductivity type and having a first end configured to receive charge accumulated by a photodiode; forming a second charge storage trench doped to have the first conductivity type; and forming a first transfer gate linking a second end of the first charge storage trench, and the second charge storage trench, to a sense node, wherein the first and second charge storage trenches are linked together by a linking channel doped to have the first conductivity type and bordering a portion of an edge of the transfer gate.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 2A is a plan view of a charge storage structure of a pixel according to an example embodiment of the present disclosure;

DETAILED DESCRIPTION OF THE PRESENT EMBODIMENTS

Throughout the following description, the term "substantially" is used to designate a tolerance of plus or minus 10 percent of the value in question. Terms relating to the orientation of a device, such as vertical, horizontal, etc., are assumed to apply when the device is oriented as shown in the corresponding figure.

While in the present description example embodiments are described in relation with a pixel capable of detecting depth in an image based on time-of-flight, it will be apparent to those skilled in the art that the principles described herein could be applied to any pixel requiring charge storage, and could thus be applied to other types of pixels comprising one or more charge storage structures, including pixels capable of a global shutter operation.

Figure 1A:
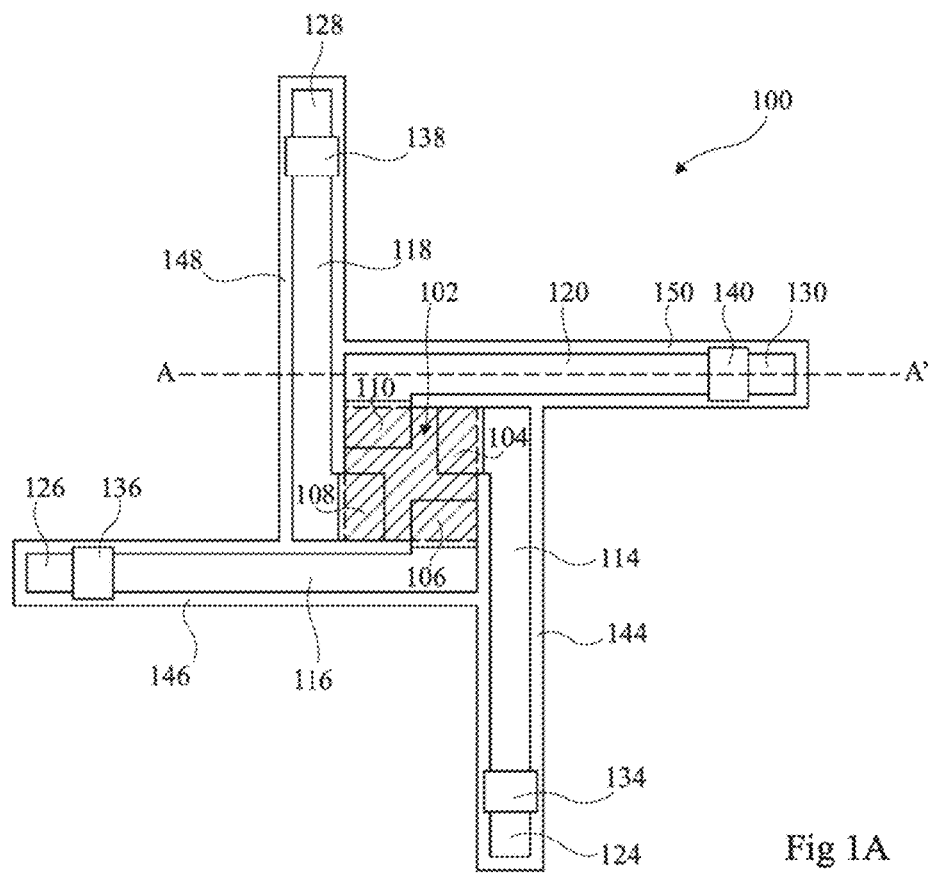
FIG. 1A is a plan view of a pixel of an image array that has been proposed.

FIG. 1A is a plan view of a pixel 100 of an image array according to an example embodiment. A similar pixel is for example described in more detail in French patent application FR16/62340 filed on 12 Dec. 2016 (attorney reference B15344).

As will be described in more detail below, the pixel 100 is for example part of an image sensor capable of capturing depth information based on so-called "time-of-flight" (ToF). Time-of-flight devices operate by transmitting a light signal into an image scene, and then detecting, using the image sensor, the return light signal reflected by objects in the image scene. By calculating the time of flight of the light signal, the distance of objects in the image scene from the sensor can be estimated. The time of flight is for example calculated by transmitting a periodic light signal into the image scene, and sampling the return signal multiple times during the period of the light signal in order to detect the phase shift of the return light signal. For example, a technique based on the detection of four samples per period is described in more detail in the publication by R. Lange and P. Seitz entitled "Solid-state TOF range camera", IEEE J. on Quantum Electronics, vol. 37, No. 3, March 2001. A technique based on the detection of three samples is described in more detail in the above-referenced French patent application FR16/62340.

The pixel 100 comprises a shaded rectangular central zone 102 corresponding to a photodiode and four transfer gates 104, 106, 108 and 110 positioned over the respective corners of the photodiode 102 and linking the photodiode to four corresponding charge storage zones 114, 116, 118 and 120. In the example of FIG. 1A, each charge storage zone 114 to 120 extends along a corresponding edge of the photodiode 102, and then continues as a protrusion from the pixel. A corresponding sense node 124, 126, 128, 130 is positioned at the other end of each charge storage zone, and is linked to the charge storage zone by a corresponding transfer gate 134, 136, 138, 140. Each charge storage zone 114 to 120 is for example bordered on all sides by a corresponding isolation trench 144, 146, 148, 150, except in an opening in the vicinity of the corresponding transfer gate 104 to 110. The isolation trenches for example comprise a conductive wall surrounded by an insulating layer so that a biasing voltage can be applied thereto. For example, the isolation trenches 144 to 150 are what is known in the art as CDTIs (capacitive deep trench isolations).

Figure 1B:
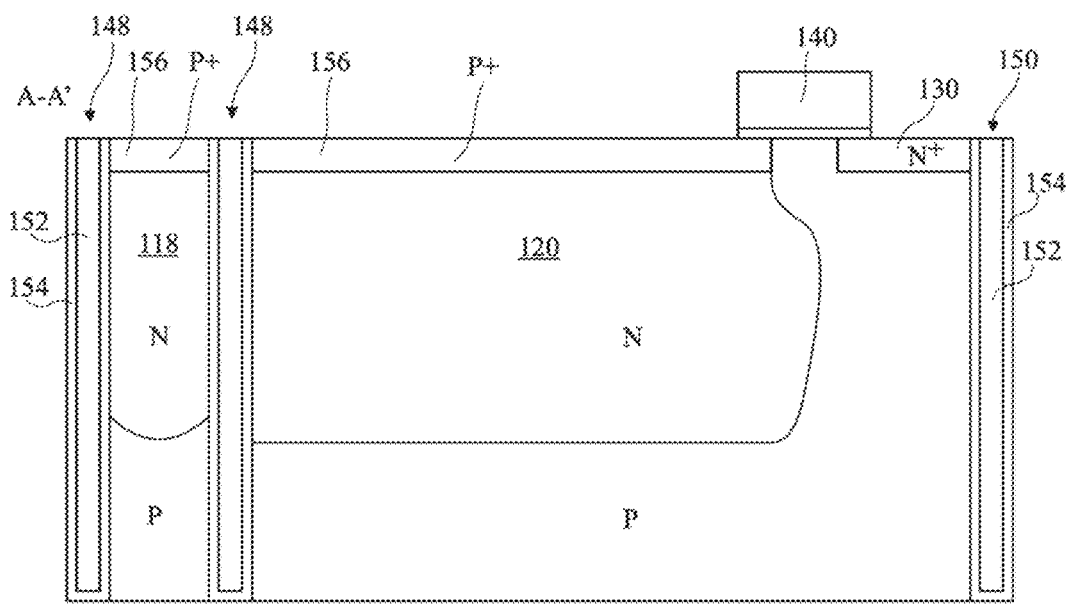
FIG. 1B is a cross-section view of the pixel of FIG. 1A.

FIG. 1B is a cross-section view taken along a line A-A' in FIG. 1A, crossing the charge storage zone 118, passing along the charge storage zone 120 and passing through the transfer gate 140 and sense node 130. As illustrated, the isolation trenches 148 and 150 each for example comprise a conductive core 152, for example of polysilicon, insulated from the charge storage zone and substrate by an insulating layer 154. In the example of FIG. 1B, the charge storage zones 118 and 120 are n-type zones, formed in a p-type substrate. The charge storage zones 118, 120 are for example covered by heavily doped p-type layers 156.

As explained above in the background section, as pixel dimensions decrease, it would be desirable to maintain the charge storage capacity of the charge storage zones 114 to 120. However, options for increasing the size of such charge storage zones are limited. Indeed, it is generally necessary to conserve the width and depth of the trenches in order to maintain the charge carrying properties. This implies maintaining or increasing the lengths of the charge storage zones. However, a difficulty is that further increasing the extent to which the charge storage zones 114 to 120 protrude away from the pixel will lead to a non-optimal layout of the pixel array.

A solution to this difficulty could be to provide charge storage zones that are no longer straight, but which include one or more bends. A difficulty however is that this risks creating potential wells due to variations in the width of the charge storage zone between the electrodes at the corners, and charge carriers therefore risk being prevented from being successfully evacuated from the entire storage zone.

FIG. 2A is a plan view of a charge storage structure 200 according to an example embodiment of the present disclosure. The charge storage structure 200 comprises charge storage trenches 202 and 204 linked by a linking channel 206. The charge storage trenches 202, 204 are for example shielded from light. The charge storage trench 202 has an end 208 configured to receive charge carriers accumulated by a photodiode PD (not illustrated in FIG. 2A). For example, the charge storage structure 200 could replace each of the charge storage zones 114 to 120 in FIG. 1A. Alternatively, the charge storage structure 200 of FIG. 2 could be incorporated in any type of pixel of an image array in which charge storage is to be provided.

The charge storage trenches 202 and 204 are for example delimited by an isolation trench 210, and the trench 204 for example has one end that is closed by the isolation trench 210. The isolation trench 210 for example has the same structure as the isolation trenches of FIG. 1A, and for example includes a conductive core allowing a biasing voltage to be applied thereto. The biasing voltage is for example chosen to be at substantially 0 V or at a negative voltage level in order to laterally pinch the photodiode and storage trenches and to electrically passivate the insulated walls of the CDTI trenches in order to limit dark current. Additionally, the implantation in the trenches 202, 204 for example results in charges being laterally pinched due for example to a higher doping concentration towards the widthwise centres of the trenches 202, 204. This helps the evacuation of charge carriers when the charge storage trenches are read.

A transfer gate 212 links the other end 214 of the charge storage trench 202 to a sense node 216. The transfer gate 212 also links the charge storage trench 204 to the sense node 216.

The linking channel 206 for example borders a portion of the edge of the transfer gate 212. For example, the width W1c of the linking channel 206 between the edge of the transfer gate 212 and the isolation trench 210 is for example in the range of 20 nm to 300 nm, and for example equal to substantially 100 nm. The length of the linking channel 206 is for example between 100 nm and 2 µm. The trench 204 for example has a length Lt, measured from the isolation trench 210 to the edge of the transfer gate 212, of between 1 µm and 10 µm, and a width Wt between the isolation trenches 210 of between 200 nm and 2 µm, and for example of substantially 400 nm. These dimensions are for example similar to those of the trench 202.

In the example of FIG. 2A, the transfer gate 212 is "L" shaped, one branch of the "L" linking the trench 202 to the sense node 216, and the other branch of the "L" linking the trench 204 to the sense node 216. Furthermore, the isolation trench 210 for example comprises a substantially right-angled bend 218 following the outer corner of the "L" shaped transfer gate 212, the linking channel 206 being formed in the space between this corner of the transfer gate 212 and the bend 218 of the isolation trench 210.

A dashed line 220 in FIG. 2A, passing through portions of the isolation trench 210 delimiting the trenches 202, 204 and close to the outer edge of the "L" shaped transfer gate 212, illustrates an example of the limits of the implantation mask used to form the storage trenches 202, 204 and the linking channel 206. A dashed line 222, passing through a portion of the isolation trench 210 and close to the inner edge of the "L" shaped transfer gate 202, illustrates an example of the limits of the implantation mask used to form the sense node 216.

The trenches 202, 204 and linking channel 206 are all for example formed of n-type silicon, and are therefore adapted to hold electrons.

Figure 2D:
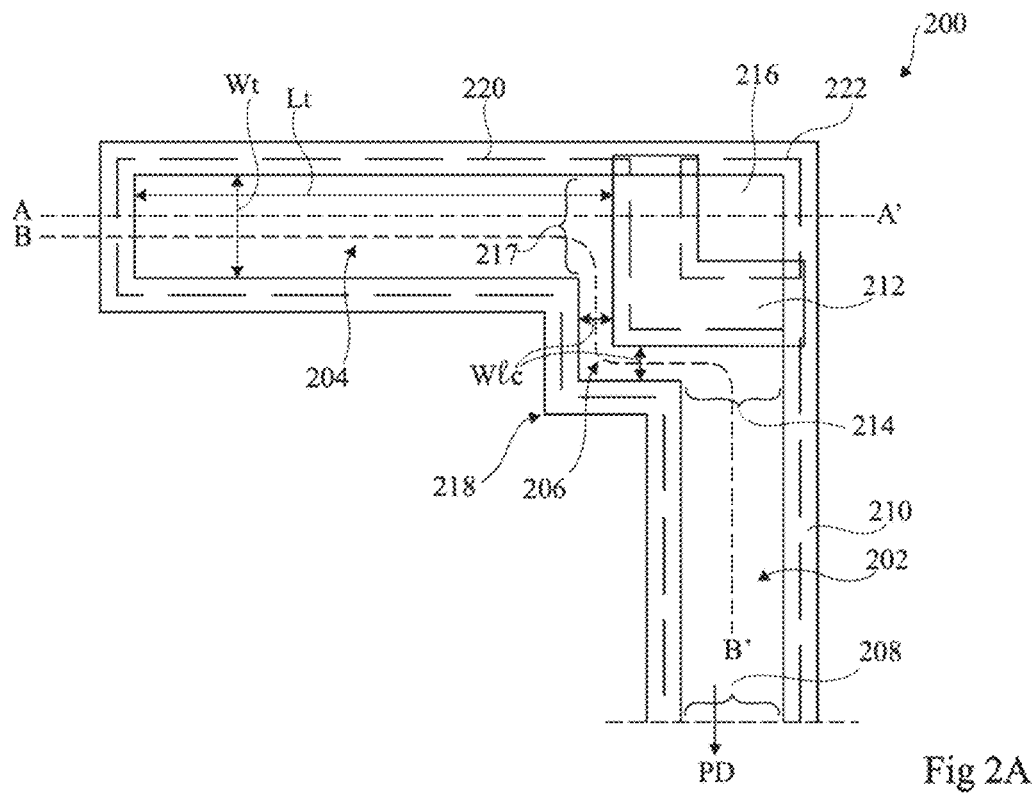
FIG. 2D is a diagram illustrating an example of peak electrostatic potential curves along cross-sections of the charge storage structure of FIG. 2A.
Figure 2D:
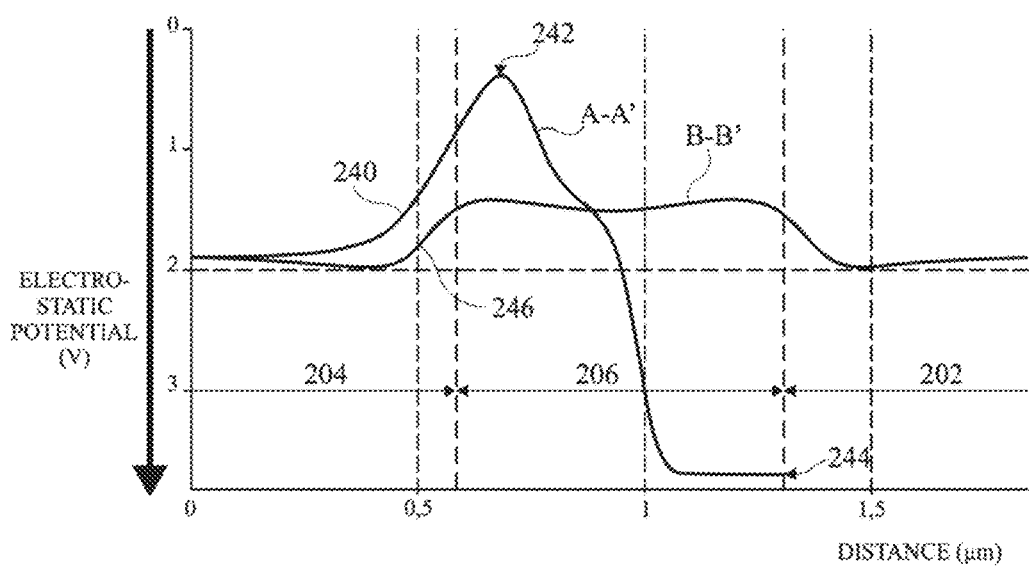
Figure 2B:
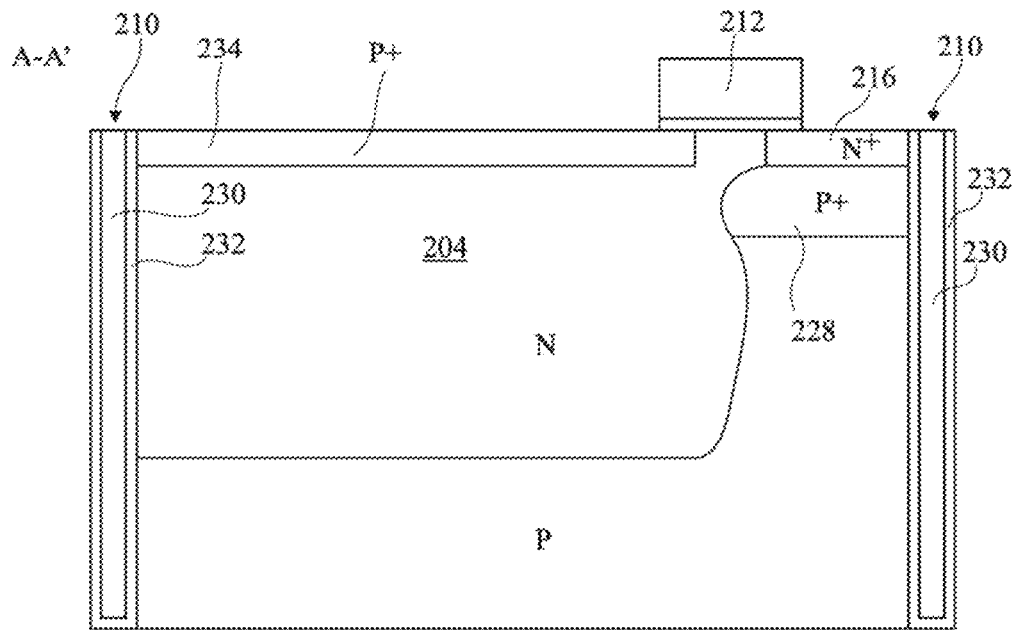
FIGS. 2B and 2C are cross-section views of the pixel of FIG. 2A according to an example embodiment.

FIG. 2B is a cross-section view of the charge storage structure 200 of FIG. 2A, taken along a line A-A' passing across the isolation trench 210, along the trench 204, through the transfer gate 212 and sense node 216, and across the isolation trench 210 again. This cross-section is very similar to the cross-section of FIG. 1B excluding the charge storage zone 118, and will not be described again in detail. However, in the example of FIG. 2B, the n-type trench 204 extends to a region under the gate 212, facilitating the charge transfer during a read phase of the charge storage trench 204. Furthermore, a heavily doped p-type (P+) region 228 is for example formed under the sense node 216 and extends partially under the gate 212, this implantation helping to prevent charge moving to the sense node 216 when the transfer gate 212 is in the non-conducting state. In FIG. 2B, the conductive core of the isolation trench 210 is labelled 230 and the insulating layer surrounding the conductive core 230 is labelled 232. Furthermore, the heavily doped p-type layer covering the charge storage trench 204 is labelled 234.

It will be noted from FIG. 2B that the n-type charge storage trench 204 is vertically pinched between the p-type layer 234 and the p-type substrate. The trench 202 for example has a similar structure.

For example, in some embodiments, the p-type substrate has a concentration of p dopants of between $1e^{14}cm^{-3}$ and $1e^{17}cm^{-3}$, the charge storage trenches 202, 204 have a concentration of n dopants of between $1e^{17}cm^{-3}$ and $1e^{20}cm^{-3}$, the layer 234 and region 228 have a concentration of p dopants of between $1e^{18}cm^{-3}$ and $1e^{21}cm^{-3}$, and the sense node 216 has a concentration of n dopants of between $1e^{19}cm^{-3}$ and $5e^{21}cm^{-3}$.

Figure 2C:
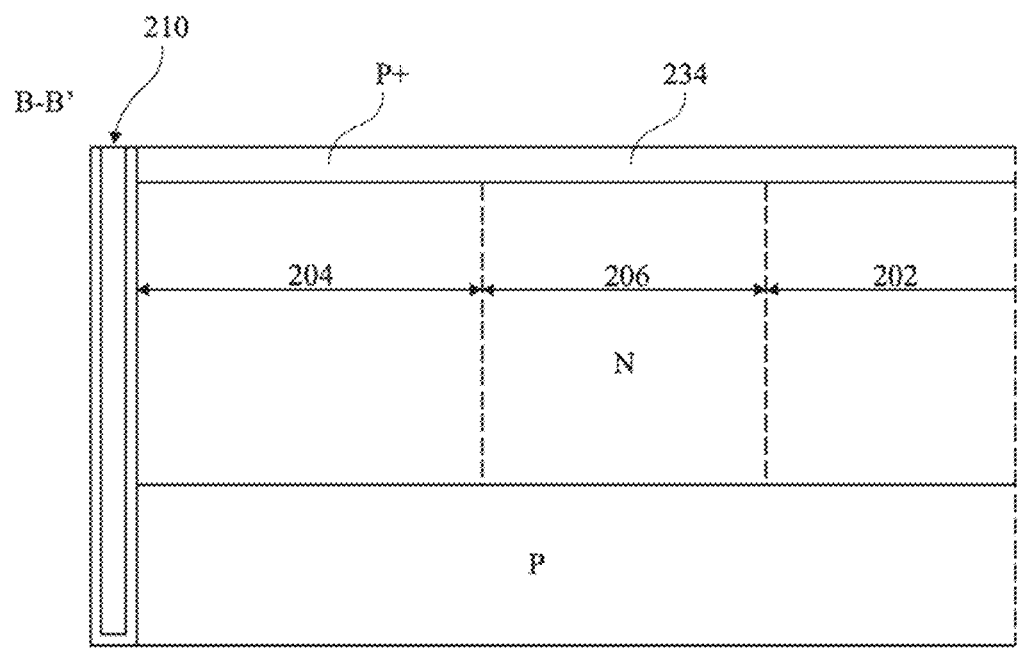

FIG. 2C is a cross-section view of the charge storage structure 200 of FIG. 2A, taken along a line B-B' passing across the isolation trench 210, along the trench 204, along the linking channel 206, and along the trench 202.

As illustrated, the depth of the n-type region forming the linking channel 206 is for example uniform along the length of the linking channel 206, and is for example the same as that in the trenches 202 and 204. Furthermore, in some embodiments, the doping concentrations are for example the same in the trenches 202, 204 and linking channel 206, avoiding the need for additional implant masks.

FIG. 2D is a diagram illustrating an example of peak electrostatic potential curves along the cross-sections A-A' and B-B' of the charge storage structure of FIG. 2A.

A curve 240 represents the peak electrostatic potential along the cross-section A-A' of FIG. 2A. It is assumed that the transfer gate 212 is non-conducting due to an appropriate voltage applied to it, which is for example a voltage of 0 V. Thus, as illustrated by the curve 240, from the channel 204, in which there is a relatively high electrostatic potential, for example of substantially 2 V, the electrostatic potential drops close to zero at a point 242 under the transfer gate 212. The electrostatic potential then for example increases rapidly to a level 244 of over 3 V at the sense node 216.

A curve 246 represents the peak electrostatic potential along the cross-section B-B'. The electrostatic potentials close to the centres of the trenches 202, 204 are for example close to 2 V, and fall in the approach to the linking channel 206. In the linking channel 206, the electrostatic potential is for example lower than in the centres of the trenches 202, 204, but higher than the level under the gate 212. For example, the electrostatic potential in the linking channel 206 is at substantially 1.5 V. This electrostatic potential in the linking channel 206 is for example chosen such that there is a partial barrier between the charge storage trenches 202 and 204, causing charge to overflow from the trench 202 to the trench 204 when a certain charge level is reached, while avoiding the charge leaking through the transfer gate 212.

In some embodiments, the dimensions of the linking channel 206, the doping concentration in the linking channel 206, and the voltage level applied to the transfer gate 212, are configured such that, when the transfer gate is non-conducting, the energy gap separating the linking channel 206 and the sense node 216 is at least 10 kT, where k is the Boltzmann constant, and T is the temperature, and in some embodiments is at least 30 kT. Advantageously, the width of the linking channel is chosen to be in the range of 20 nm to 300 nm to avoid potential wells forming between the two charge storage trenches during the read phase, while maintaining a potential difference greater than 10 kT while the transfer gate is non-conducting. Furthermore, the linking channel 206 provides an electrostatic potential barrier between the charge storage trenches 202 and 204, and the linking channel is for example configured such that the electrostatic potential barrier is lower than an electrostatic potential barrier between the charge storage trench 202 and the sense node 216.

While not illustrated in FIG. 2D, the potential barrier between the charge storage trenches is calibrated such that no potential barrier is formed along the linking channel when the voltage applied to the transfer gate 216 renders it conductive. For example, the transfer gate 216 is rendered conductive by application of a positive voltage of between 1 and 3 V, causing charges stored in the trenches 202 and 204 to be evacuated to the sense node 216, from where they can be read in a conventional manner.

Figure 3A:
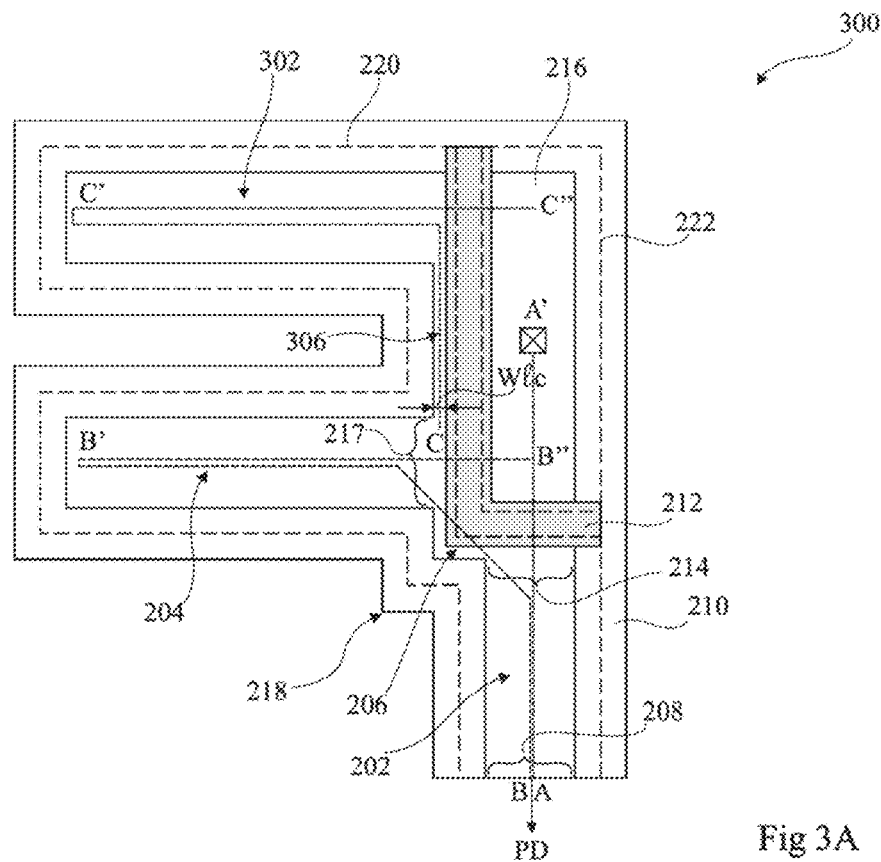
FIG. 3A is a plan view of a charge storage structure of a pixel according to a further example embodiment of the present disclosure.

FIG. 3A is a plan view of a charge storage structure 300 according to a further example embodiment. The charge storage structure 300 is similar to the charge storage structure 200 of FIG. 2A, and like features have been labelled with like reference numerals and will not be described again in detail.

With respect to the structure 200, the structure 300 comprises a further charge storage trench 302 that communicates with the charge storage trench 204 via a linking channel 306. The trench 302 for example runs substantially parallel with the trench 204, such that the charge storage structure 300 resembles a backwards letter "F". Each of the trenches 204 and 302 for example has one end that is closed by the isolation trenches 210.

Like the linking channel 206, the linking channel 306 for example runs along an edge of the transfer gate 212, which is extended in FIG. 3A to also link the trench 302 with the sense node 216. However, unlike the linking channel 206, the linking channel 306 is for example straight. For example, the width W1c of the linking channel 306 between the edge of the transfer gate 212 and the isolation trench 210 is in the range of 5 nm to 1 µm. The length of the linking channel 306 is for example between 100 nm and 2 µm.

Figure 3B:
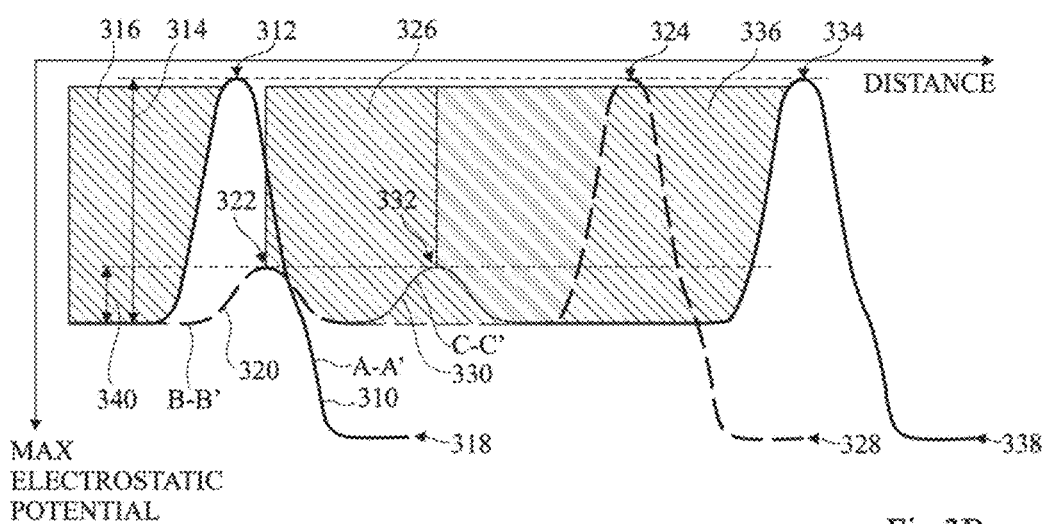
FIG. 3B is a diagram illustrating an example of peak electrostatic potential curves along cross-sections of the charge storage structure of FIG. 3A.

FIG. 3B is a diagram illustrating an example of peak electrostatic potential curves along the cross-sections A-A', B-B'-B" and C-C'-C" of the charge storage structure of FIG. 3A. It is assumed that the transfer gate 212 is non-conducting due to an appropriate voltage applied to it, which is for example a voltage of 0 V.

A curve 310 represents the peak electrostatic potential along the cross-section A-A', which runs from the end 208 of the trench 202, along the trench 202, across the transfer gate 212, and into the sense node 216. From the channel 202, in which there is for example an electrostatic potential close to 2 V, the electrostatic potential drops close to zero at a point 312 under the transfer gate 212. An arrow 314 in FIG. 3B represents the potential difference between the trench 202 and the transfer gate 212, and a shaded region 316 in FIG. 3B represents the charge storage capacity of the trench 202, which is a function of the potential difference 314. The peak electrostatic potential shown by the curve 310 then for example increases rapidly to a level 318 of over 3 V at the sense node 216.

A dashed curve 320 represents the peak electrostatic potential along the cross-section B-B'-B", which runs along the trench 202, diagonally through the linking channel 206, along the trench 204 to its end, then back along the trench 204, across the transfer gate 212 and into the sense node 216. As shown by the curve 320, the peak electrostatic potential falls to a low point 322 in the linking channel 206, before returning to a relatively high potential in the trench 204. The electrostatic potential then drops close to zero at a point 324 under the transfer gate 212. A shaded region 326 represents the charge storage capacity of the trench 204. The peak electrostatic potential shown by the curve 320 then for example increases rapidly to a level 328 of over 3 V at the sense node 216.

A curve 330 represents the peak electrostatic potential along the cross-section C-C'-C", which runs from the trench 204, along the linking channel 306, along the trench 302 to its end, then back along the trench 302, across the transfer gate 212 and into the sense node 216. From the channel 204, in which there is for example an electrostatic potential approaching 2 V, the electrostatic potential falls to a low point 332 in the linking channel 306, before returning to a relatively high potential in the trench 302. The electrostatic potential then drops close to zero at a point 334 under the transfer gate 212. A shaded region 336 represents the charge storage capacity of the trench 302. The peak electrostatic potential shown by the curve 330 then for example increases rapidly to a level 338 of over 3 V at the sense node 216.

An arrow 340 in FIG. 3B represents the potential difference between the electrostatic potentials in the trenches 202, 204, 302 and the electrostatic potentials in the linking channels 206, 306. For example, the dimensions of the linking channels 206 and 306, the doping concentration in the linking channels 206 and 306, and the voltage level applied to the transfer gate 212, are configured such that the energy gap separating the linking channels 206, 306 and the sense node 216 is at least 10 kT, where k is the Boltzmann constant, and T is the temperature, and in some embodiments is at least 30 kT.

Figure 4:
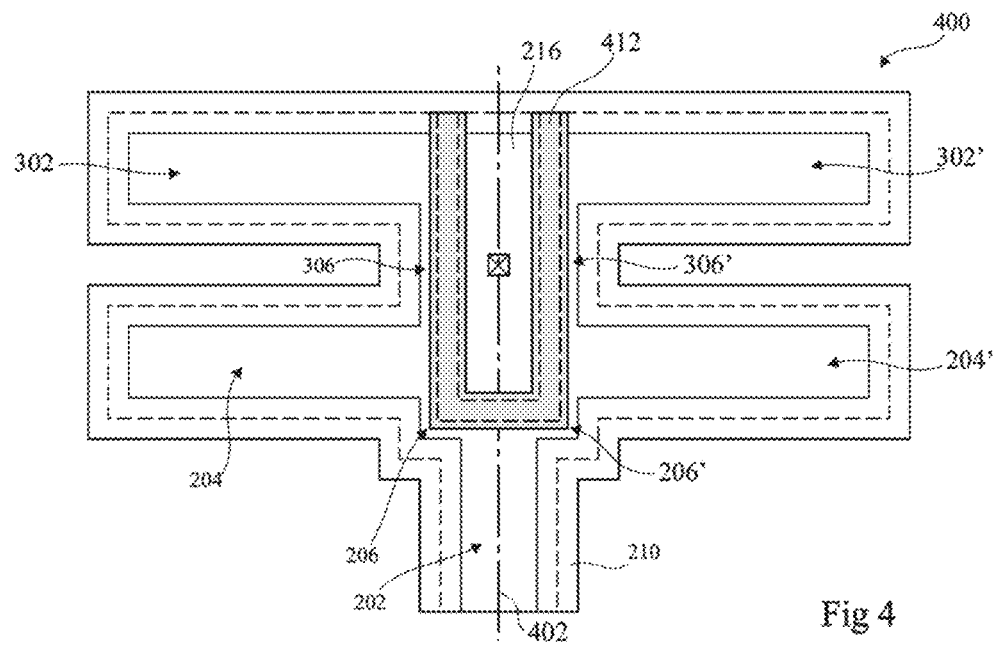
FIG. 4 is a plan view of a charge storage structure of a pixel according to a further example embodiment of the present disclosure.

FIG. 4 is a plan view of a charge storage structure 400 according to a further example embodiment. Many features are similar to those of the structure 300 of FIG. 3A, and such features have been labelled with like reference numerals and will not be described again in detail. In particular, the charge storage structure 400 is for example the same as the charge storage structure 300, except that it has been rendered symmetrical with respect to an axis of symmetry 402 running along the trench 202, and through the sense node 216. There is thus a further charge storage trench 204' symmetrically opposite the trench 204, and yet a further charge storage trench 302' symmetrically opposite the trench 302. The trenches 204' and 302' are for example linked to each other by a linking channel 306' similar to the channel 306. The transfer gate 212 is for example replaced in the structure 400 by a transfer gate 412 having a "U" shape surrounding the sense node 216 on all sides except one, and thereby linking the trenches 204' and 302' to the sense node 216.

Figure 5:
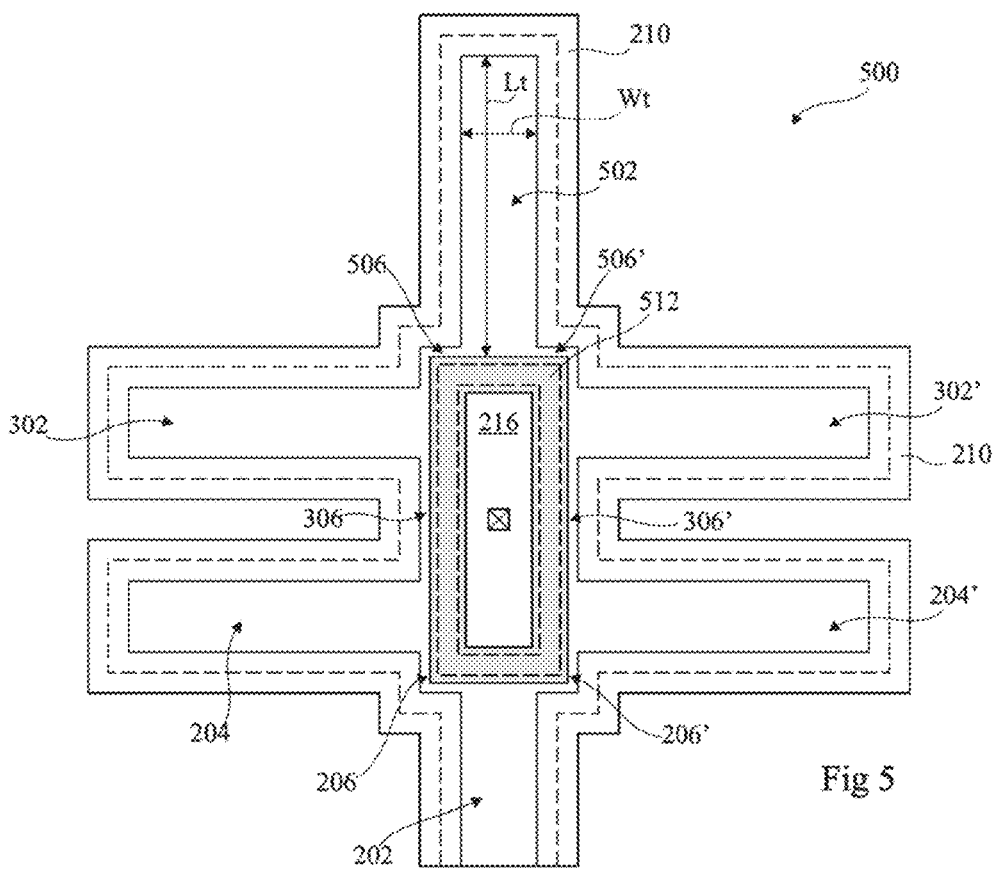
FIG. 5 is a plan view of a charge storage structure of a pixel according to yet a further example embodiment of the present disclosure.

FIG. 5 is a plan view of a charge storage structure 500 according to yet a further example embodiment. The structure 500 is for example similar to the structure 400 of FIG. 4, and like features have been labelled with like reference numerals and will not be described again in detail. The structure 500 for example additionally comprises a charge storage trench 502 extending opposite the trench 202, and for example linked to the trench 302 by a linking channel 506 and to the trench 302' by a linking channel 506'. The linking channels 506 and 506' are for example similar to the linking channels 206 and 206'. The transfer gate 412 of FIG. 4 is for example replaced in the structure 500 by a transfer gate 512 in the form of a square letter "O", with the sense node 216 entirely surrounded by the transfer gate 512. The transfer gate 512 links not only the trenches 204, 204', 302 and 302' to the sense node 216, but also the trench 502 to the sense node 216.

Like the trenches 204, 204', 302 and 302', the trench 502 for example has a length Lt from the isolation trench 210 to the edge of the transfer gate 512 of between 1 µm and 10 µm, and a width Wt between the isolation trenches 210 of between 200 nm and 2 µm.

Figure 6:
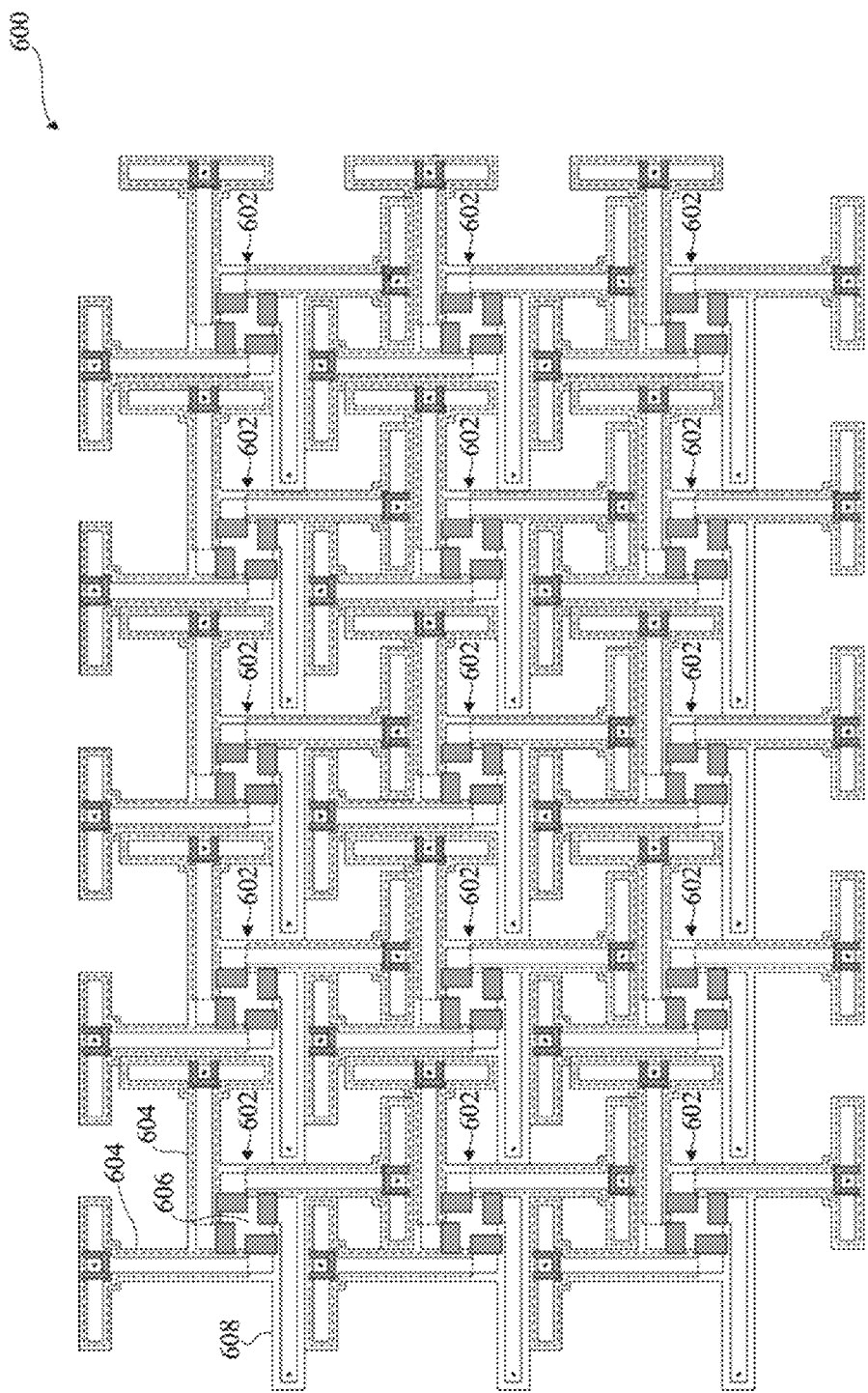
FIG. 6 is a plan view of an image array comprising pixels having charge storage structures according to an example embodiment of the present disclosure.

FIG. 6 is a plan view of an image array 600, which is for example a depth sensor based on time-of-flight. The image array 600 for example comprises pixels 602, each pixel 602 comprising charge storage structures 604 (labelled only in the top left pixel of FIG. 6). The example of FIG. 6 shows 15 pixels arranged in a 5 by 3 array. However, any array dimensions would be possible. The charge storage structures 604 are for example each similar to the structure 400 of FIG. 4, except that the trenches 302 and 302' have been omitted, such that the structure has the shape of a letter "T".

Each pixel 602 comprises a photodiode 606 (labelled only in the top left pixel of FIG. 6), which is similar to the photodiode 102 of FIG. 1A, and four transfer gates are arranged over it similar to the transfer gates 104, 106, 108 and 110 of FIG. 1A. In the embodiment of FIG. 6, each pixel 602 comprises three charge storage structures 604 extending from three respective sides of the photodiode 606. These for example allow three samples to be captured per period of the periodic light signal as described above with reference to FIG. 1A. A further structure 608 extending from the fourth side of the photodiode 606 of each pixel 602 is for example used for photodiode reset and/or for anti-blooming purposes.

Advantageously, it will be seen in FIG. 6 that the "T" shaped charge storage structures can be arranged in a space efficient layout with relatively little empty chip area surrounding each pixel. For example, the bar of the "T" of certain charge storage structures runs adjacent to the stem of the "T" of the charge storage structures of adjacent pixels.

A further advantage of the "T" shaped charge storage structure is that the sense node 216 can have relatively small dimensions, while the number of charge storage trenches provide relatively high charge storage capacity. A similar advantage would be present in the structure of FIG. 5 in which the trenches 302 and 302' are omitted such that the charge storage structure forms a cross or "+" shape. In such a structure, the trench 502 is for example linked to the trenches 204, 204' by linking channels similar to the channels 506, 506' illustrated in FIG. 5.

An advantage of the embodiments described herein is that charge storage structures may provide additional charge storage volume without extending the length of the charge storage trenches, and while permitting effective charge evacuation during the read phase.

Having thus described at least one illustrative embodiment, various alterations, modifications and improvements will readily occur to those skilled in the art. For example, while embodiments based on the storage of electrons in n-type trenches have been described, it will be apparent to those skilled in the art that the same principles could be applied to the storage of holes in p-type trenches.

Furthermore, while embodiments have been described in which the charge storage trenches are delimited by isolation trenches having a conductive core, it will be apparent to those skilled in the art that different types of isolation trenches could be employed, and additionally or alternatively implantations could be used to delimit the charge storage trenches.

Furthermore, while particular example layouts of the linking channels 206 and 306 have been described, it will be apparent to those skilled in the art that further embodiments would be possible. It would also be possible to include a plurality of sense nodes for a given charge storage structure, the sense nodes being coupled together by the metal layers, and allowing several charge storage trenches to be linked in a chain via the sense nodes.

What is claimed is:

1. A pixel of an image array comprising one or more charge storage structures, each charge storage structure comprising:
    a first charge storage trench doped to have a first conductivity type and having a first end configured to receive charge accumulated by a photodiode;
    a second charge storage trench doped to have the first conductivity type; and
    a first transfer gate linking a second end of the first charge storage trench, and the second charge storage trench, to a sense node, wherein the first and second charge storage trenches are linked together by a linking channel doped to have the first conductivity type and bordering a portion of an edge of the transfer gate, wherein the linking channel provides an electrostatic potential barrier between the first and second charge storage trenches, the linking channel being configured such that the electrostatic potential barrier is lower than an electrostatic potential barrier between the first charge storage trench and the sense node.

2. The pixel of claim 1, wherein the linking channel has a width of between 20 nm and 300 nm.

3. The pixel of claim 1, wherein the linking channel comprises a right-angled bend.

4. The pixel of claim 1, wherein the dimensions of the linking channel, the doping concentration in the linking channel, and/or a voltage level applied to the first transfer gate, are configured such that the energy gap separating the linking channel and the sense node is at least 10 kT, where k is the Boltzmann constant, and T is the temperature.

5. The pixel of clam 1, wherein the second charge storage trench extends perpendicular to the first charge storage trench.

6. The pixel of claim 5, wherein, in addition to said first and second charge storage trenches, each charge storage structure comprises at most two further charge storage trenches, the trenches of each charge storage structure forming a "T" shape or a cross shape.

7. The pixel of claim 1, wherein the pixel further comprises a photodiode linked to the first charge storage trench by a second transfer gate.

8. The pixel of claim 1, wherein the first and second charge storage trenches are laterally delimited along at least a portion of their length by capacitive isolation trenches configured to be biased by a biasing voltage.

9. The pixel of claim 1, further comprising a third charge storage trench doped to have the first conductivity type and linked to the first or second charge storage trench by a further linking channel doped to have the first conductivity type and bordering a further portion of the edge of the transfer gate.

10. The pixel of claim 1, comprising a plurality of said charge storage structures.

11. An image array comprising an array of pixels, each pixel corresponding to the pixel of claim 1.

12. A method of fabricating a pixel of an image array, the method comprising forming one or n ore charge storage structures, each charge storage structure being formed by:
    forming a first charge storage trench doped to have a first conductivity type and having a first end configured to receive charge accumulated by a photodiode;
    forming a second charge storage trench doped to have the first conductivity type; and
    forming a first transfer gate linking a second end of the first charge storage trench, and the second charge storage trench, to a sense node, wherein the first and second charge storage trenches are linked together by a linking channel doped to have the first conductivity type and bordering a portion of an edge of the transfer gate, wherein the linking channel provides an electrostatic potential barrier between the first and second charge storage trenches, the linking channel being configured such that the electrostatic potential barrier is lower than an electrostatic potential barrier between the first charge storage trench and the sense node.

* * * * *